US008468691B2

(12) United States Patent
Lefevre et al.

(10) Patent No.: US 8,468,691 B2
(45) Date of Patent: Jun. 25, 2013

(54) METHOD FOR PRODUCING AN ELECTRONIC MODULE BY MEANS OF SEQUENTIAL FIXATION OF THE COMPONENTS, AND CORRESPONDING PRODUCTION LINE

(75) Inventors: Bruno Lefevre, Draveil (FR); Christian Schwartz, Chatou (FR); Jean-Yves Moreno, Meru (FR)

(73) Assignee: Valeo Systemes de Controle Moteur, Cergy Saint Christophe (FR)

( * ) Notice: Subject to any disclaimer, the term of this patent is extended or adjusted under 35 U.S.C. 154(b) by 206 days.

(21) Appl. No.: 12/279,483

(22) PCT Filed: Feb. 15, 2007

(86) PCT No.: PCT/FR2007/000271
§ 371 (c)(1),
(2), (4) Date: Dec. 15, 2008

(87) PCT Pub. No.: WO2007/093710
PCT Pub. Date: Aug. 23, 2007

(65) Prior Publication Data
US 2009/0217519 A1      Sep. 3, 2009

(30) Foreign Application Priority Data

Feb. 16, 2006 (FR) ...................... 06 01356

(51) Int. Cl.
*H05K 3/34* (2006.01)
*H05K 3/30* (2006.01)
(52) U.S. Cl.
USPC .............................. 29/840; 29/832
(58) Field of Classification Search
USPC ............. 29/840, 825, 830, 832; 228/180.21, 228/187, 223
See application file for complete search history.

(56) References Cited

U.S. PATENT DOCUMENTS 3,380,155 A * 4/1968 Burks ........................ 438/617
3,501,832 A * 3/1970 Iwata et al. ................... 29/840
(Continued)

FOREIGN PATENT DOCUMENTS

DE      43 30 467 C1    9/1994
JP      05-185762 A     7/1993
(Continued)

OTHER PUBLICATIONS

International Search Report w/translation from PCT/FR2007/000271 dated Aug. 3, 2007 (6 pages).
(Continued)

*Primary Examiner* — David Angwin
(74) *Attorney, Agent, or Firm* — Osha • Liang LLP

(57) ABSTRACT

A process for manufacturing an electronic module including a printed-circuit board, at least one first-type component and one second-type component is disclosed. The process involves placing solder on the board, putting the first-type component in a first position, heating the entire board to melt the solder, resulting in soldering of the first-type component, putting the second-type component in a second position such that the second-type component has leads bearing on the board via the solder, and heating the solder locally to melt the solder such that the second-type component is soldered by applying two electrodes on each lead of the second-type component and making an electrical current flow between the electrodes to heat each lead of the second-type component. Each of the two electrodes directly contacts each lead of the second-type component to make the current flow between the two electrodes via the corresponding lead of the second-type component.

7 Claims, 1 Drawing Sheet

U.S. PATENT DOCUMENTS

| | | | | | |
|---|---|---|---|---|---|
| 3,558,993 | A | * | 1/1971 | Rigby | 361/777 |
| 3,586,816 | A | * | 6/1971 | Hagen | 219/121.63 |
| 3,632,955 | A | * | 1/1972 | Cruickshank et al. | 219/85.12 |
| 3,680,196 | A | * | 8/1972 | Leinkram | 228/123.1 |
| 3,811,182 | A | * | 5/1974 | Ryan et al. | 29/25.01 |
| 4,196,839 | A | * | 4/1980 | Davis | 228/180.1 |
| 4,254,448 | A | * | 3/1981 | Martyniak | 361/777 |
| 4,361,862 | A | * | 11/1982 | Martyniak | 361/772 |
| 4,635,354 | A | * | 1/1987 | Chrobak et al. | 29/622 |
| 4,774,126 | A | * | 9/1988 | Dorsey et al. | 428/209 |
| 4,821,946 | A | * | 4/1989 | Abe et al. | 228/180.21 |
| 4,889,275 | A | * | 12/1989 | Mullen et al. | 228/180.21 |
| 5,075,965 | A | * | 12/1991 | Carey et al. | 29/840 |
| 5,167,361 | A | * | 12/1992 | Liebman et al. | 228/180.22 |
| 5,172,852 | A | * | 12/1992 | Bernardoni et al. | 228/180.21 |
| 5,186,378 | A | * | 2/1993 | Alfaro | 228/110.1 |
| 5,259,546 | A | * | 11/1993 | Volk | 228/102 |
| 5,289,966 | A | * | 3/1994 | Izumi et al. | 228/180.21 |
| 5,394,608 | A | * | 3/1995 | Tottori et al. | 29/840 |
| 5,477,419 | A | * | 12/1995 | Goodman et al. | 361/760 |
| 5,495,089 | A | * | 2/1996 | Freedman et al. | 219/121.64 |
| 5,515,605 | A | * | 5/1996 | Hartmann et al. | 29/840 |
| 5,574,629 | A | * | 11/1996 | Sullivan | 361/767 |
| 5,829,125 | A | * | 11/1998 | Fujimoto et al. | 29/840 |
| 5,996,222 | A | * | 12/1999 | Shangguan et al. | 29/840 |
| 6,129,955 | A | * | 10/2000 | Papathomas et al. | 427/517 |
| 7,754,975 | B2 | * | 7/2010 | Gloede et al. | 174/252 |
| 2003/0146264 | A1 | * | 8/2003 | Miyazaki | 228/51 |

FOREIGN PATENT DOCUMENTS

| | | |
|---|---|---|
| JP | 05-211390 A | 8/1993 |
| JP | 7312412 A | 11/1995 |
| JP | 2001-044616 A | 2/2001 |

OTHER PUBLICATIONS esp@cenet Abstract of JP5211390; Publication dated Aug. 20, 1993; Nippon Electric Company (1 page).

esp@cenet Abstract of DE4330467; Publication dated Sep. 8, 1994; Siemens Nixdorf Inf Syst (1 page).

International Search Report w/translation from PCT/FR2007/000270 dated Jul. 30, 2007 (4 pages).

esp@cenet Abstract of JP7312412; Publication date Nov. 28, 1995; Hitachi Ltd. (1 page).

Japanese Office Action for Application No. 2008-554812, mailed on Jan. 18, 2011 (5 pages).

Patent Abstracts of Japan for Japanese Publication No. 05-185762, publication date Jul. 27, 1993 (1 page).

Patent Abstracts of Japan for Japanese Publication No. 2001-044616, publication date Feb. 16, 2001 (1 page).

* cited by examiner

METHOD FOR PRODUCING AN ELECTRONIC MODULE BY MEANS OF SEQUENTIAL FIXATION OF THE COMPONENTS, AND CORRESPONDING PRODUCTION LINE

The present invention relates to a process for manufacturing an electronic module, for example one that can be used in the automotive field, and to a corresponding production line.

BACKGROUND OF THE INVENTION

An electronic module generally comprises a printed-circuit board to which electronic components are soldered.

Current manufacturing processes comprise the steps of placing the solder on the board, generally in the form of a paste, of putting the components in position on said board and of melting the solder by passing the board though a reflow oven. This step of melting the solder is commonly referred to as the component soldering step. The presence of bulky components on the board or concentrations of components in certain zones of the board result in temperature gradients in the board, that is to say the various zones of the board do not reach the set temperature of the reflow oven at the same time. These temperature gradients generate thermal stresses both on the board and on the components that have been heated most. The thermal stresses may result in a deterioration in performance and premature aging of the components. To avoid or limit these temperature gradients it is necessary to produce, depending on each type of module, specific thermal profiles of the reflow oven that prove to be tricky to control.

The bulkiest components also limit the heat exchange for optimally melting the solder, by masking the smallest components or smallest parts thereof.

Furthermore, these bulkiest components mask other components and prevent these masked components from being checked visually.

Moreover, with the known processes using a reflow oven, passage through the reflow oven limits the maximum height that the components can have.

In addition, the appearance of new standards relating to the composition of the solder run the risk of raising the melting temperature of the solder. There is a risk of this temperature rise increasing the thermal stresses experienced by the components. It will then be necessary, in order to produce the bodies of the components, to use improved high-performance plastics in order to withstand this temperature without being damaged. Certain components whose performance may be affected by excess heat will also have to be improved.

SUBJECT OF THE INVENTION

One object of the invention is to provide a means for limiting the thermal stresses when manufacturing an electronic module.

SUMMARY OF THE INVENTION

For this purpose, the invention provides a process for manufacturing an electronic module comprising a printed-circuit board, at least one first-type component and one second-type component, characterized in that the process comprises the steps of:
placing solder on the board;
putting the first-type component in position;
heating the entire board to melt the solder, so as to solder the first-type component;
putting the second-type component in position in such a way that it has leads bearing on the board via solder; and
heating the solder locally to melt it so as to solder the second-type component.

Thus, the overall heating of the card enables the solder to be melted over the entire board and several components to be simultaneously and rapidly soldered, while the local heating enables precise soldering operations to be carried out by limiting the heating of the components. The soldering of the first-type component is performed before the second-type component is put in place. The second-type component therefore does not impede the soldering of the first-type component nor the operations of checking the quality of this soldering. The bulky components will, for example, then be put in position after the first soldering step. It is also possible to avoid concentrations of components by distributing the soldering of the close components over the two soldering operations. Deterioration of the temperature-sensitive components may also be avoided by fixing them during the second soldering operation.

Advantageously, the soldering of the second-type component is carried out by applying two electrodes on each lead of the component and by making an electrical current flow between the electrodes in order to heat each lead of the component.

With this soldering method, only the leads of the component are heated, in such a way that the component itself and the surrounding components are subjected to little or no temperature rise. It is therefore possible to use components having relatively modest temperature resistance properties.

Another subject of the invention is a production line for implementing this process. The production line comprises a unit for putting the first-type components in place, a general heating unit for melting a solder placed between the first-type components and the circuit, a unit for putting the second-type components in place and a local heating unit for melting a solder placed between the second-type components and the circuit.

Other features and advantages of the invention will become apparent on reading the following description of one particular nonlimiting embodiment of the invention.

BRIEF DESCRIPTION OF THE DRAWINGS

Reference will be made to the appended drawings, in which.

DETAILED DESCRIPTION OF THE INVENTION

Referring to the figures, the manufacturing process according to the invention is implemented on a production line, designated generally as 1, for manufacturing electronic modules generally designated as 2.

An electronic module 2 comprises a board 3 on which a conducting circuit 4 has been formed in order to constitute, in a manner known per se, a printed-circuit board. The board 3 is of the IMS (insulated metal substrate) type. The circuit 4 may be formed from a conductive ink spread by screen printing on the board 3. The circuit may also consist of metal tracks fastened to the board 3.

Figure 1:
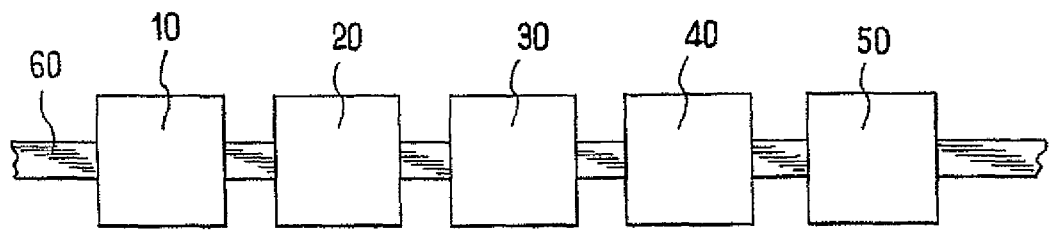
FIG. 1 is a schematic view of a production line for manufacturing electronic modules according to the invention.
Figure 2:
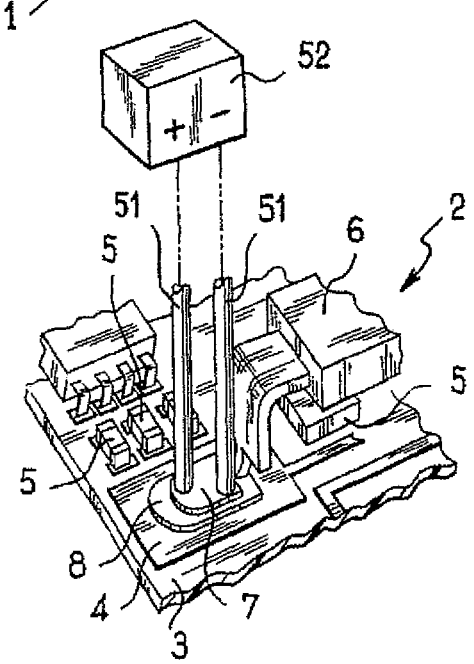
FIG. 2 is a partial schematic view in perspective of such a module during the soldering of a component.
Figure 3:
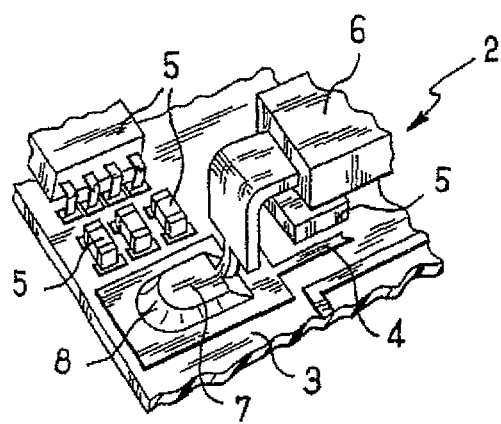
FIG. 3 is a view similar to that of FIG. 2 of this module after the component has been soldered.

The module 2 also comprises first-type components 5 and a second-type component 6 having connection leads 7, only one of which is shown in FIGS. 2 and 3. The components 5, such as drive components, are smaller than the component 6, which is for example a power component. The component 6 here lies on top of one of the components 5. The connection leads, or more generally the connection members, of the components 5 and 6 are fixed to the circuit 4 by melted solder 8. The solder 8 here is solder paste consisting of a mixture of tin and lead.

The production line 1 comprises a unit 10 for depositing the solder 8 on the circuit 4 of the boards 3, a unit 20 for putting the components 5 in place, an overall heating unit 30, consisting here of a reflow oven, a unit 40 for putting the component 6 in place and a unit 50 for local heating of the components 6.

The units 10, 20, 30 and 40 are known per se.

The local heating unit 50 comprises pairs of electrodes 51 connected to a power supply 52, which here delivers a current of around 3000 amps at a minimum frequency of 1000 hertz. The electrodes here are made of copper-tungsten (25% copper and 75% tungsten).

The various units are linked together conventionally by a conveyer 60 for transporting the boards 3.

The circuit 4 is already printed on the boards 3 when they enter the production line 1.

In the unit 10, the solder 8 is deposited by screen printing on the connection pads of the circuit 4 for the components 5 and 6.

The components 5 are then placed by the unit 20 on the circuit 4 so that the connection members of the components 5 rest on the solder 8 deposited on the corresponding connection pads of the circuit 4.

The board 3 thus furnished with the components 5 passes into the overall heating unit, i.e. the reflow oven 30 which melts the solder 8 and enables the components 5 to be soldered.

It is possible to carry out a visual check of the soldering of the components 5 upon emerging from the reflow oven 30. Since the component 6 is not on the board when it passes through the reflow oven 30, the mass to be heated during this passage is relatively low. This makes it possible to use lower-capacity ovens or pass more boards simultaneously through the oven.

Next, the board 3 passes through the unit 40 in which the component 6 is put in position on the circuit 4 so that the leads 7 of the component 6 rest on the solder 8 deposited on the corresponding connection pads of the circuit 3.

The components 6 are then soldered by applying a pair of electrodes 51 on each lead 7 of the components 6 so as to make an electrical current flow between said electrodes via the corresponding lead 7 and heat each lead 7 of the component 6 sufficiently to melt the solder 8. It will be noted that the pressure of the electrodes on the part to be soldered ensures that the part to be soldered is properly pressed against the circuit. To give an example, the electrodes may exert a force of 12 daN on the part to be soldered.

Melting the solder by means of the electrodes has the advantage of being extremely rapid (less than one second), whereas passage through a reflow oven lasts about one minute.

It is possible to influence the quality of the solder or to adapt the soldering to the materials or components to be soldered by modifying the soldering profile (and in particular the current intensity curve as a function of time, the mechanical pressure of the electrodes on the leads of the components), the geometry of the electrodes (so as in particular to allow better heat extraction), the force exerted on the part (so as to maintain contact between the electrode and the part and prevent the formation of a spark) and the spacing and positioning of the electrodes on the leads (in particular to modify the path of the current through the leads). The temperature of the electrodes is kept approximately constant and relatively low, around 40° C., so as to maintain the same soldering conditions for all the parts, hence the benefit of providing means for facilitating the removal of heat at the electrodes, such as a suitable geometry.

Of course, the invention is not limited to the embodiment described and embodiment variations may be imparted thereto without departing from the scope of the invention as defined by the claims.

In particular, it is possible to deposit the solder used for soldering the components 6 after the components 5 have been soldered by a screen printing operation. The solder may also be deposited directly on the leads of the components before they are put in place on the circuit.

It is possible to heat the paste of the components differently, for example by applying a soldering iron bit on each lead of the components 6 or of the components 5. The heating unit 50 may be a reflow oven.

The electrodes may be made of various metals, especially copper, tungsten, molybdenum, etc. The electrodes thus may be made of copper-tungsten (25% copper and 75% tungsten) as in the embodiment described or made of copper and comprise a tungsten tip for serving as a point of contact with the part to be soldered.

The parts to be soldered may be made of copper, brass, an alloy or a metal, whether tinned or not. The board may be of the IMS type as described or may be of another type comprising, for example, a glass fabric/epoxy resin circuit such as boards of the FR4 type.

It is possible to use other, lead-free solders, based on tin, based on silver, etc. The solder may also be deposited in the form of a metal strip either on the circuit or on the connection members of the components.

The modules may of course have a structure different from that of the above embodiment, which was presented merely to explain the invention and is in no way limiting. The components 6 put in place after the boards have passed through the reflow oven 30 may be bulky components or components that might be damaged by the heat within the oven. The components 6 may be identical to the components 5 but soldered subsequently, in order to prevent excessively high concentrations of components during the first soldering operation.

The invention claimed is:

1. A process for manufacturing an electronic module comprising a printed-circuit board, at least one first-type component and one second-type component, wherein the process comprises:
   placing solder on the board;
   putting the first-type component in a first position;
   heating the entire board to melt the solder, resulting in soldering of the first-type component;
   putting the second-type component in a second position such that the second-type component has leads bearing on the board via the solder; and
   heating the solder locally to melt the solder such that the second-type component is soldered,
   wherein heating the solder locally comprises applying two electrodes on each lead of the second-type component and making an electrical current flow between the electrodes in order to heat each lead of the second-type component, wherein each of the two electrodes directly contacts each lead of the second-type component so as to make the electrical current flow between the two electrodes via the corresponding lead of the second-type component.

2. The process as claimed in claim 1, wherein heating the entire board to melt the solder comprises passing the board through a reflow oven.

3. The process as claimed in claim 1, in which a phase of adapting the soldering to the second-type component is carried out by modifying at least one of the parameters selected from a group consisting of a soldering profile, a current intensity curve for the electrodes, a mechanical pressure of the electrodes on the leads of the second-type component, a geometry of the electrodes, and a spacing and a positioning of the electrodes on the leads of the second-type component.

4. The process as claimed in claim 1, in which the solder used for soldering the second-type component is placed on the circuit of the board at the same time as the solder used for soldering the first-type component.

5. The process as claimed in claim 1, wherein the solder is a solder paste.

6. The process as claimed in claim 1, further comprising:
   depositing the solder on the leads of the second-type component prior to placing the second-type component into position.

7. The process as claimed in claim 1, wherein putting the second-type component in position comprises:
   placing the second-type component on top of the first-type component.

* * * * *